(12) United States Patent
Arai

(10) Patent No.: US 8,981,260 B2
(45) Date of Patent: Mar. 17, 2015

(54) TEMPERATURE CONTROL CIRCUIT OF OVEN-CONTROLLED CRYSTAL OSCILLATOR

(75) Inventor: Junichi Arai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 446 days.

(21) Appl. No.: 13/541,669

(22) Filed: Jul. 4, 2012

(65) Prior Publication Data

US 2013/0008883 A1   Jan. 10, 2013

(30) Foreign Application Priority Data

Jul. 8, 2011 (JP) ................................. 2011-151472
Apr. 16, 2012 (JP) ................................. 2012-092996

(51) Int. Cl.

| H05B 1/00 | (2006.01) |
|---|---|
| H03L 1/02 | (2006.01) |
| G05D 23/24 | (2006.01) |
| H03L 1/04 | (2006.01) |
| H03B 1/00 | (2006.01) |

(52) U.S. Cl.
CPC ............ *H03L 1/022* (2013.01); *G05D 23/2413* (2013.01); *H03L 1/028* (2013.01); *H03L 1/04* (2013.01)
USPC ........... 219/210; 219/209; 219/497; 310/314; 331/69

(58) Field of Classification Search
CPC . G05D 23/24; G05D 23/2413; G05D 23/241; G05D 23/2401; G05D 23/2403; G05D 23/2422; G05D 23/2424; G05D 23/2439; G05D 23/2408; H03L 1/00; H03L 1/04; H03L 1/028; H03L 1/022; H03L 1/02; H05B 1/023; H05B 1/0233; H05B 1/0263; H03H 9/08; H03H 9/05

See application file for complete search history.

(56) References Cited

FOREIGN PATENT DOCUMENTS

| JP | 11-317622 | 11/1999 |
|---|---|---|
| JP | 2004-207870 | 7/2004 |
| JP | 2005-117093 | 4/2005 |
| JP | 2006-311496 | 11/2006 |

*Primary Examiner* — Shawntina Fuqua
(74) *Attorney, Agent, or Firm* — Jianq Chyun IP Office

(57) ABSTRACT

A temperature control circuit of oven-controlled crystal oscillator includes a heater resistor, a first resistor, a thermistor, a second resistor, a third resistor, a differential amplifier, a PNP-type power transistor, and a PNP-type current-limiting transistor. The thermistor outputs a voltage depending on a temperature. The differential amplifier amplifies a difference between the voltage received by the one input terminal and the voltage received by the other and output as a control voltage. The PNP-type power transistor includes an emitter where the other end of the heater resistor is connected, a base that receives an output of the differential amplifier, and a grounded collector. The PNP-type current-limiting transistor has an emitter where a power voltage is supplied, a base that receives a voltage between the other end of the heater resistor and the emitter of the power transistor, and a collector connected to the base of the power transistor.

18 Claims, 11 Drawing Sheets

TEMPERATURE CONTROL CIRCUIT OF OVEN-CONTROLLED CRYSTAL OSCILLATOR

CROSS REFERENCE TO RELATED APPLICATIONS

This application claims the priority benefit of Japan application serial no. 2011-151472, filed on Jul. 8, 2011, and Japan application serial no. 2012-092996, filed on Apr. 16, 2012. The entirety of each of the above-mentioned patent applications is hereby incorporated by reference herein and made a part of this specification.

TECHNICAL FIELD

This disclosure relates to an oven-controlled crystal oscillator (OCXO) capable of obtaining a high stability oscillation frequency, and more particularly, to a temperature control circuit of the oven-controlled crystal oscillator capable of implementing an excellent temperature characteristic.

Background Discussion

<Prior Art>
The oven-controlled crystal oscillator is used to obtain a high stability oscillation frequency without generating a frequency variation depending on a frequency/temperature characteristic by maintaining a constant operational temperature of the crystal unit. The crystal unit is stored in a thermostatic oven, and the thermostatic oven is controlled to maintain a constant internal temperature using a temperature control circuit.

<Temperature Control Circuit of Oven-Controlled Crystal Oscillator in Prior Art: FIG. 8>
The temperature control circuit of the oven-controlled crystal oscillator in prior art will be described with reference to FIG. 8. FIG. 8 is a circuit diagram illustrating the temperature control circuit of the oven-controlled crystal oscillator in prior art. The temperature control circuit of the oven-controlled crystal oscillator in prior art basically includes a thermistor TH, a differential amplifier (OPAMP) IC10, a power transistor Tr1, and a heater resistor HR as illustrated in FIG. 8.

<Connection Relationship>
A power voltage DC is applied to one end of the heater resistor HR, the other end of the heater resistor HR is connected to the collector of the power transistor Tr1, and the emitter of the power transistor Tr1 is connected to the ground GND.

The power voltage DC is also applied to one end of the thermistor TH, the other end of the thermistor TH is connected to one end of the resistor R1, and the other end of the resistor R1 is grounded. In addition, the power voltage DC is also applied to one end of the resistor R2, the other end of the resistor R2 is connected to one end of the resistor R3, and the other end of the resistor R3 is grounded. Furthermore, although not illustrated in the drawings, the power voltage DC as a driving voltage is applied to the differential amplifier IC10 and is also connected to the ground GND.

A node between the other end of the thermistor TH and one end of the resistor R1 is connected to one terminal (negative (−) terminal) of the differential amplifier IC10 through the resistor R4, and a node between the other end of the resistor R2 and one end of the resistor R3 is connected to the other terminal (positive (+) terminal) of the differential amplifier IC10. In addition, the negative terminal (−) and the output terminal of the differential amplifier IC10 are connected through the resistor R5. The output terminal of the differential amplifier IC10 is connected to the base of the power transistor Tr1.

<Each Unit>
The thermistor TH is a temperature-sensing element, of which a resistance value changes depending on a temperature, and detects the operational temperature of the crystal unit. A voltage between the thermistor TH and the resistor R1 is input to one input terminal (negative (−) terminal) through the resistor R4, the output of the differential amplifier IC10 is fed back and input through the resistor R5, and a voltage between the resistors R2 and R3 is input to the other input terminal (positive (+) terminal), so that the differential amplifier IC10 amplifies and outputs a voltage difference of the two input terminals.

The power transistor Tr1 is an NPN-type transistor, in which the output of the differential amplifier IC10 is input to a base, and an electric current flows between the collector and the emitter depending on the base current, so that the electric current also flows to the heater resistor HR. The heater resistor HR generates heat depending on the flowing electric current. Here, the power transistor Tr1 and the heater resistor HR serve as heat sources.

In the OCXO, if the heat source, the sensor of the thermistor TH, and the crystal unit can be integrated into a single body, temperature characteristic performance is improved. However, since the three parts described above are not electrically connected in practice, they are not physically connected. For this reason, the three parts are arranged as close as possible, and an insulation material such as resin is interposed therebetween. However, such an insulation material has a generally low thermal conductivity. For example, silicon resin has a thermal conductivity of approximately 2 W/m·k even if its performance is excellent.

In the heat source, although a collector terminal portion of the power transistor Tr1 generates heat, an electric potential is generated at all times. The heater resistor HR is made of ceramic as a base material, and a heat-generating resistance film is formed on its top surface so as to generate heat therefrom. However, it is known that the heat sources of the heater resistor HR and the power transistor Tr1 generate different heat amounts depending on an ambient temperature variation.

<Heat Amount against Electric Current: FIG. 9>
The heat amount against the electric current flowing through the temperature control circuit will be described with reference to FIG. 9. FIG. 9 is a graph illustrating the heat amount. In FIG. 9, the abscissa denotes an electric current, and the ordinate denotes a heat amount. As illustrated in FIG. 9, the heat amount of the power transistor Tr1 is different from the heat amount of the heater resistor HR, and a total heat amount obtained by summing both heat amounts becomes the heat amount of the heat source. Therefore, as the ambient temperature changes, a difference is generated between the heat amount of the power transistor Tr1 and the heat amount of the heater resistor HR.

<Related Techniques>
As the related techniques, there are disclosed: "Temperature Control Circuit For Crystal Oscillator" in Japanese Patent Application Laid-open No. H11-317622, assigned to TOYO Communication Equipment Co., Ltd. (hereinafter referred to as Patent Literature 1); "Package for Piezoelectric Vibrator, and Constant Temperature Oscillator Employing the Same" in Japanese Patent Application Laid-open No. 2004-207870, assigned to KYOCERA Corp. (hereinafter referred to as Patent Literature 2); "Temperature Control Circuit and High Stability Crystal Oscillator Employing the Same" in Japanese Patent Application Laid-open No. 2005-

117093, assigned to TOYO Communication Equipment Co., Ltd. (hereinafter referred to as Patent Literature 3); and "Constant Temperature Crystal Oscillator" in Japanese Patent No. 4855087, assigned to Nihon Dempa Kogyo Co., Ltd. (hereinafter referred to as Patent Literature 4).

Patent Literature 1 discloses a temperature control circuit for controlling a temperature of the thermostatic oven in the crystal oscillator, in which a control current of the heating element can be controlled to increase depending on the detection temperature by selecting a high resistance value of the thermistor.

Patent Literature 2 discloses a constant temperature oscillator, in which a first package having the piezoelectric device is hermetically encapsulated by a second package to vacuumize the housing portion of the second package.

Patent Literature 3 discloses a temperature control circuit of a high stability crystal oscillator including a first voltage-dividing circuit for dividing a constant voltage using a first thermistor and a resistor, a second voltage-dividing circuit for dividing a constant voltage using a second thermistor and a variable resistor, and an differential amplifier for inputting the voltage divided by the first voltage-dividing circuit to a positive (+) input terminal and inputting the voltage divided by the second voltage-dividing circuit to a negative (−) input terminal.

Patent Literature 4 discloses a constant temperature crystal oscillator, in which a dummy terminal in a board side of the circuit board connected to the dummy terminal of the crystal unit is connected to a resistor terminal in a board side connected to a temperature-sensing resistor through a conduction path.

However, in the oven-controlled crystal oscillator in prior art, it is known that the heater resistor HR and the power transistor Tr1 as heat sources have different heat amounts depending on a change of the ambient temperature as described above. For this reason, there is a problem in that, in the oven-controlled crystal oscillator in prior art, a temperature difference is generated when the ambient temperature changes, so that the temperature characteristic of the oscillator is degraded.

Since a voltage from the power supply is also applied to the thermistor TH which is a sensor as illustrated in FIG. 8, it is difficult to make direct contact with the heat source. Therefore, heat transfer efficiency is deteriorated, and it is difficult to efficiently maintain a constant temperature using the minimum heat.

<Addition of Current-Limiting Circuit: FIG. 10>

In this regard, it is conceivable that a current-limiting circuit is added to the temperature control circuit as illustrated in FIG. 10. A temperature control circuit having the current-limiting circuit will be described with reference to FIG. 10. FIG. 10 is a circuit diagram illustrating the temperature control circuit having the current-limiting circuit. In the temperature control circuit of FIG. 10, compared to the circuit of FIG. 8, the current-limiting transistor Tr2 is provided, the collector of the transistor Tr2 is connected to the base of the power transistor Tr1 where the output of the differential amplifier IC10 is input, and the base of the transistor Tr2 is connected to the emitter of the power transistor Tr1 and is grounded through the resistor R6. In addition, the emitter of the transistor Tr2 is grounded. Here, the power transistor Tr1 and the current-limiting transistor Tr2 are NPN-type transistors.

While the electric current flowing through the base of the power transistor Tr1 increases, and the electric current flowing between the collector and the emitter increases as the output voltage from the differential amplifier IC10 increases, the maximum electric current flowing between the collector and the emitter of the transistor Tr2 is controlled by the current detection resistor R6 and the current-limiting transistor Tr2. At the same time, the voltages applied to the power transistor Tr1 and the heater resistor HR may be adjusted to control the heat amount (electric power) of each element.

In the circuit of FIG. 10, since about 0.7 V is necessary in the voltage VBE between the base and the emitter of the current-limiting transistor Tr2 for limiting the current of the power transistor Tr1, a total heat amount (electric power) of the power transistor Tr1 and the heater resistor HR as heat sources is disadvantageously reduced. In addition, since an electric potential is applied to the collector of the power transistor Tr1, it is difficult to make direct electric connection between the thermistor TH and the collector side of the power transistor Tr1. Therefore, it is desirable to further improve the heat transfer efficiency.

Patent Literature 1 and 2 fail to consider further improvement of the thermal conduction efficiency in the circuit by preventing thermal dispersion. In addition, Patent Literature 3 fails to provide a configuration for making direct connection between the power transistor and the thermistor by using the power transistor as a heat source although sensitivity of the temperature sensor may be improved.

In the circuit of FIG. 8, although control is made to generate heat from the heat source such that the temperature detected by the thermistor TH (temperature sensor) is maintained constantly, an element to be stabilized as the crystal oscillator is the crystal unit. Even when a detection temperature of the temperature sensor is maintained constantly, a temperature difference is generated between the detection temperature and the crystal unit due to influence of the thermal resistance. For this reason, the temperature difference between the temperature sensor and the crystal unit causes useless heat radiation or an unstable temperature.

In order to reduce a temperature difference between the temperature sensor and the crystal unit, it is necessary to integrate the crystal unit, the temperature sensor, and the heat source into a single body. For this reason, it is necessary to provide a large thermal chamber. In addition, as the thermal resistance increases, a hunting phenomenon occurs so that the output fluctuates. This makes it difficult to design a control system.

<Improved Thermostatic Oven Control Circuit: FIG. 11>

In order to address the aforementioned problems, a circuit of FIG. 11 has been proposed. FIG. 11 is a circuit diagram illustrating an improved thermostatic oven control circuit. As illustrated in FIG. 11, the improved thermostatic oven control circuit is basically similar to the circuit of FIG. 8. However, they are different in that a dummy terminal of the crystal unit is connected to the node between the thermistor TH and the resistor R20 through a metal cover.

In the circuit of FIG. 11, it is possible to reduce a thermal resistance between the crystal unit and the temperature sensor by connecting the crystal unit package and the temperature sensor. However, since there is no electrical connection in a thermal resistance between the crystal unit and the heat source and a thermal resistance between the temperature sensor and the heat source, the thermal resistance has an arbitrary value, and it is difficult to perfectly remove the aforementioned influence. In addition, the circuit disclosed in Patent Literature 4 as illustrated in FIG. 11 also fails to remove the influence caused by the fact that it is difficult to electrically connect the crystal unit, the temperature sensor, and the heat source.

A need thus exists for a temperature control circuit of an oven-controlled crystal oscillator capable of preventing thermal dispersion and improving thermal conduction efficiency in the circuit with an excellent temperature characteristic.

SUMMARY

According to an aspect of the disclosure, there is provided a temperature control circuit of a thermostatic oven in an oven-controlled crystal oscillator, including: a heater resistor having one end where a power voltage is supplied to generate heat; a first resistor having one end where a power voltage is supplied; a thermistor of which one end is connected to the other end of the first resistor, and the other end is grounded, so that a voltage depending on a temperature is output to the one end by setting a resistance value to be variable depending on a temperature; a second resistor having one end where a power voltage is supplied; a third resistor of which one end is connected to the other end of the second resistor, and the other end is grounded; a differential amplifier of which one input terminal receives a voltage between the other end of the first resistor and the one end of the thermistor, the other input terminal receives a voltage between the other end of the second resistor and the one end of the third resistor, and an output is fed back to the one input terminal through a fourth resistor, so that a difference between the voltage received by the other input terminal and the voltage received by the one input terminal is amplified and output as a control voltage; a PNP-type power transistor having an emitter where the other end of the heater resistor is connected, a base that receives an output of the differential amplifier, and a collector which is grounded; and a PNP-type current-limiting transistor having an emitter where a power voltage is supplied, a base that receives a voltage between the other end of the heater resistor and the emitter of the power transistor, and a collector connected to the base of the power transistor.

According to another aspect of the disclosure, there is provided a temperature control circuit of a thermostatic oven in an oven-controlled crystal oscillator, including: a heater resistor having one end where a power voltage is supplied to generate heat; a first resistor having one end where a power voltage is supplied; a thermistor of which one end is connected to the other end of the first resistor, and the other end is grounded, so that a voltage depending on a temperature is output to the one end by setting a resistance value to be variable depending on a temperature; a second resistor having one end where a power voltage is supplied; a third resistor of which one end is connected to the other end of the second resistor, and the other end is grounded; a differential amplifier of which one input terminal receives a voltage between the other end of the first resistor and the one end of the thermistor, the other input terminal receives a voltage between the other end of the second resistor and the one end of the third resistor, and an output is fed back to the one input terminal through a fourth resistor, so that a difference between the voltage received by the other input terminal and the voltage received by the one input terminal is amplified and output as a control voltage; a P-type field-effect power transistor (power MOSFET) having a source where the other end of the heater resistor is connected, a gate that receives an output of the differential amplifier, and a drain which is grounded; and a PNP-type current-limiting transistor having an emitter where a power voltage is supplied, a base that receives a voltage between the other end of the heater resistor and the source of the power MOSFET, and a collector connected to the gate of the power MOSFET.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Embodiments of the disclosure will be described with reference to the accompanying drawings.

<Outline of Embodiments>

In a temperature control circuit of an oven-controlled crystal oscillator according to an exemplary embodiment disclosed herein, a collector side of a PNP-type power transistor and one end of a thermistor are connected to a ground level using a metal common pattern, a PNP-type current-limiting transistor is provided for limiting the electric current flowing through a heater resistor connected to the emitter of the power transistor, and heat sources are unified into a power transistor to prevent thermal dispersion, so that the heat of the collector of the power transistor can be efficiently transferred to the commonly-connected thermistor. Therefore, it is possible to improve thermal responsiveness and implement an oscillator having an excellent temperature characteristic.

In the temperature control circuit of the oven-controlled crystal oscillator according to an embodiment disclosed herein, a drain side of the P-type power MOSFET and one end of the thermistor are connected to a ground level using a metal common pattern, a PNP-type current-limiting transistor is provided for limiting the electric current flowing through the heater resistor connected to a source of the power MOSFET, and the heat sources are unified into the power MOSFET to prevent thermal dispersion, so that the heat of the drain of the power MOSFET can be efficiently transferred to the commonly-connected thermistor. Therefore, it is possible to improve thermal responsiveness and implement an oscillator having an excellent temperature characteristic.

The oven-controlled crystal oscillator according to an embodiment disclosed herein is provided with the temperature control circuit described above. In the oven-controlled crystal oscillator according to an embodiment disclosed herein, it is possible to prevent heat radiation to the outside and maintain a constant temperature in the inside using the minimum heat by encapsulating the inside of the metal cover in vacuum.

Figure 1:
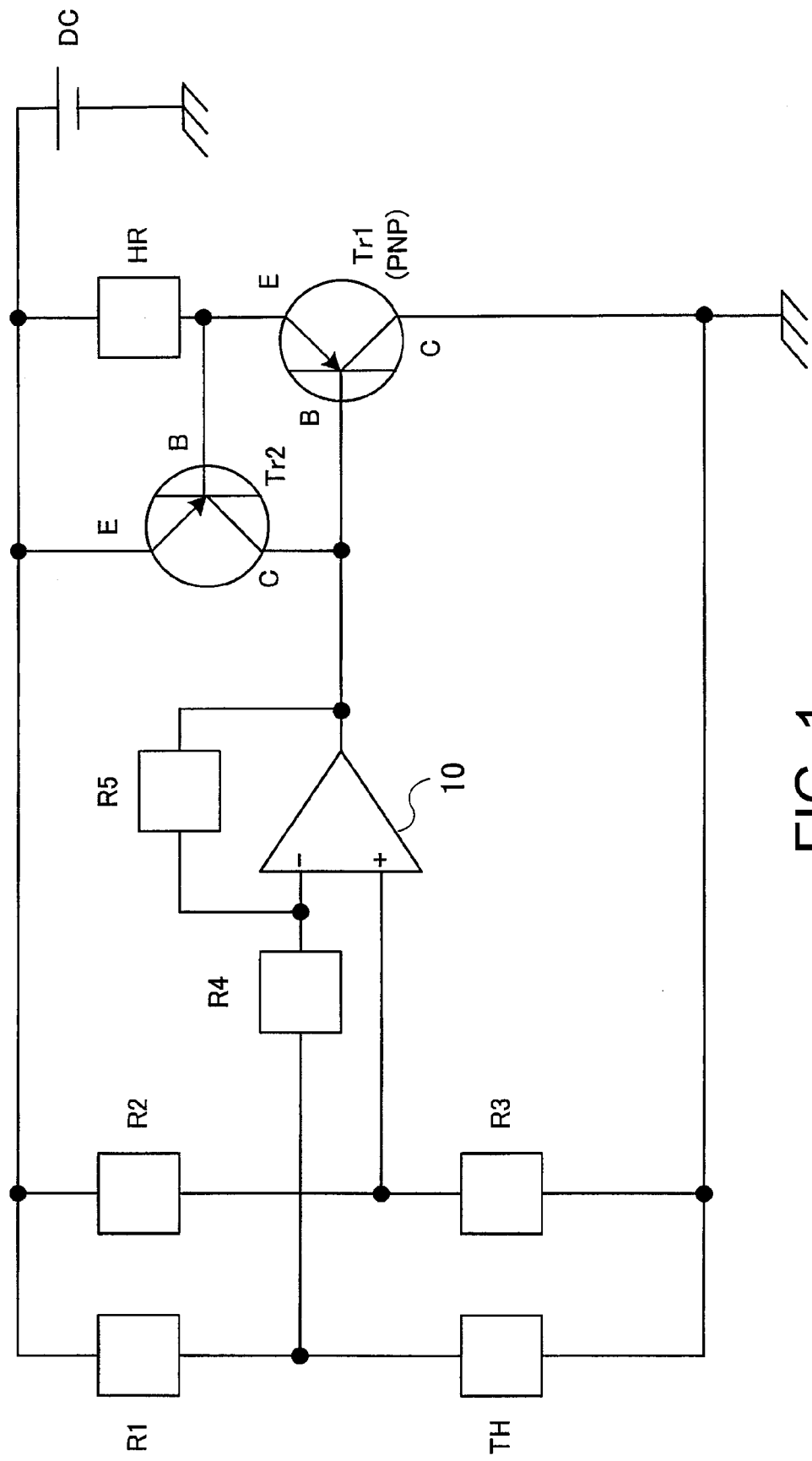
FIG. 1 is a circuit diagram illustrating a first temperature control circuit of an oven-controlled crystal oscillator according to an exemplary embodiment disclosed herein.

<First Temperature Control Circuit of Oven-Controlled Crystal Oscillator: FIG. 1>

A first temperature control circuit of the oven-controlled crystal oscillator according to an embodiment disclosed herein will be described with reference to FIG. 1. FIG. 1 is a circuit diagram illustrating the first temperature control circuit of the oven-controlled crystal oscillator according to an embodiment disclosed herein. The first temperature control circuit (first circuit) of the oven-controlled crystal oscillator according to an embodiment disclosed herein basically includes a thermistor TH, a differential amplifier (OPAMP) IC10, a power transistor Tr1, a heater resistor HR, and a current-limiting transistor Tr2 as illustrated in FIG. 1. In addition, the power transistor Tr1 and the current-limiting transistor Tr2 are not NPN-type transistors but PNP-type transistors.

<Connection Relationship in First Circuit>

The power voltage DC is applied to one end of the heater resistor HR, the other end of the heater resistor HR is connected to the emitter of the power transistor Tr1, and the collector of the power transistor Tr1 is connected to the ground GND.

The power voltage DC is applied to one end of the resistor R1, the other end of the resistor R1 is connected to one end of the thermistor TH, and the other end of the thermistor TH is connected to the ground GND. In addition, the power voltage DC is applied to one end of the resistor R2, the other end of the resistor R2 is connected to one end of the resistor R3, and the other end of the resistor R3 is connected to the ground GND.

A node between the other end of the resistor R1 and one end of the thermistor TH is connected to one input terminal (negative (−) terminal) through the resistor R4, and a node between the other end of the resistor R2 and one end of the resistor R3 is connected to the other input terminal (positive (+) terminal) of the differential amplifier IC10. In addition, the output terminal and the input terminal (negative (−) terminal) of the differential amplifier IC10 are fed back through a resistor 5 and connected to each other. The output terminal of the differential amplifier IC10 is connected to a base of the power transistor Tr1. Although not illustrated in the drawings, the power voltage DC is applied to the differential amplifier IC10 for operation, which is also connected to the ground GND.

The power voltage DC is applied to the emitter of the current-limiting transistor Tr2, a node between the other end of the heater resistor HR and the emitter of the power transistor Tr1 is connected to the base of the current-limiting transistor Tr2, and the collector of the current-limiting transistor Tr2 is connected to the base of the power transistor Tr1.

<Each Unit of First Circuit>

<Thermistor TH>

The thermistor TH is a temperature-sensing element, of which a resistance value changes depending on a temperature, and is used to detect an operational temperature of the crystal unit. According to an exemplary embodiment, the other end of the thermistor TH is connected to the ground layer GND common to the collector of the power transistor Tr1 at a ground level.

That is, the other end of the thermistor TH and the collector of the power transistor Tr1 are physically and electrically connectable. In terms of thermal conduction, while insulative thermal conduction silicon has a conductivity of 2 W/m·k in prior art, according to an exemplary embodiment, if the ground pattern GND is made of copper, the conductivity becomes 403 W/m·k which is 200 times that of prior art. As a result, it is possible to configure the oven-controlled crystal oscillator with high thermal responsiveness.

<Differential Amplifier IC10>

In the differential amplifier IC10, a voltage between the resistor R1 and the thermistor TH is input to one input terminal (negative (−) terminal) through the resistor R4, and the output of the differential amplifier IC10 is fed back and input through the resistor R5. A voltage between the resistors R2 and R3 is input to the other input terminal (positive (+) terminal), and a voltage difference between two input terminals is amplified and output.

<Power Transistor Tr1>

The power transistor Tr1 is a PNP-type transistor, in which the output of the differential amplifier IC10 is input to the base, an electric current flows between the emitter and the collector depending on the voltage applied to the base, so that an electric current also flows through the heater resistor HR. The power transistor Tr1 limits the electric current flowing through the heater resistor HR depending on the operation of the current-limiting transistor Tr2, so that the heater resistor HR does not serve as a heat source, and only the power transistor Tr1 serves as a heat source. Particularly, the collector (GND side) of the power transistor Tr1 generates heat.

<Heater Resistor HR>

The heater resistor HR receives the power voltage DC and generates heat depending on the flowing electric current based on the operation of the power transistor Tr1. However, the heater resistor HR does not serve as a heat source because the flowing electric current is limited by the operation of the current-limiting transistor Tr2 unlike the temperature control circuit in prior art that does not have the current-limiting circuit. Therefore, since only the power transistor Tr1 serves as a heat source, it is possible to prevent thermal dispersion.

<Current-Limiting Transistor Tr2>

In the current-limiting transistor Tr2, a voltage of the node on the line for connecting the other end of the heater resistor HR and the emitter of the power transistor Tr1 is applied to the base, and the electric current flowing through the emitter connected to the power voltage DC and the collector connected to the base of the power transistor Tr1 is controlled depending on the applied voltage.

That is, the voltage applied to the base of the current-limiting transistor Tr2 becomes variable depending on the electric current flowing through the emitter of the power transistor Tr1, so that the electric current flowing through the emitter and the collector of the current-limiting transistor Tr2 also becomes variable.

Specifically, if the electric current flowing through the emitter of the power transistor Tr1 increases, the maximum electric current is determined by the current-limiting transistor Tr2 and the current detection resistor, and the heat amount of the heater resistor is limited, so that the electric current is almost consumed by the power transistor Tr1. In addition, if the electric current flowing through the emitter of the power transistor Tr1 is reduced, the electric current flowing through the emitter and the collector of the current-limiting transistor tr2 is also reduced, so that it is not operated.

Figure 2:
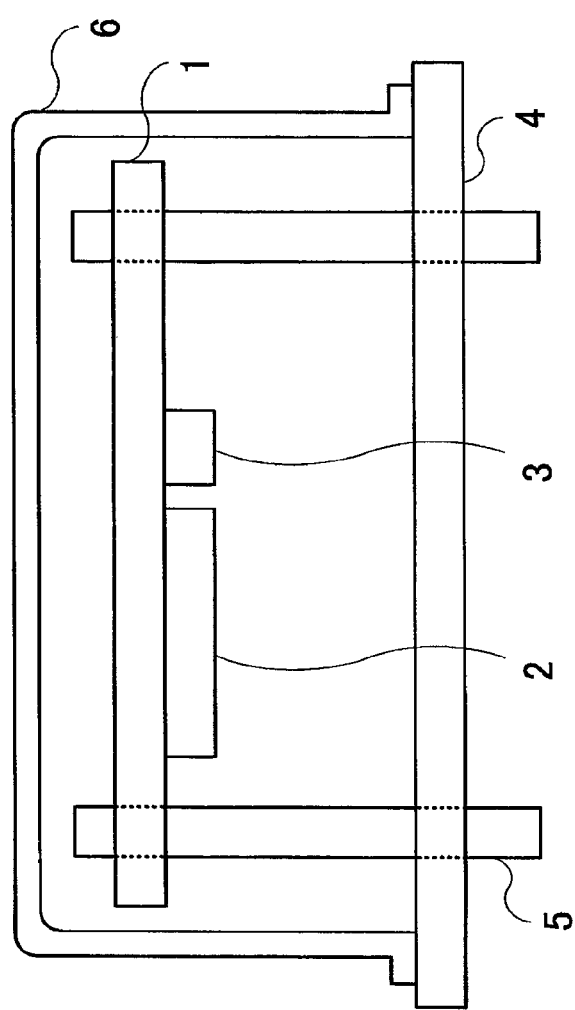
FIG. 2 is an explanatory cross-sectional view illustrating a first OCXO according to an exemplary embodiment.

<Configuration of First OCXO: FIG. 2>

Next, a configuration of the first OCXO according to an exemplary embodiment will be described with reference to FIG. 2. FIG. 2 is an explanatory cross-sectional view illustrating the first OCXO according to an exemplary embodiment. In the OCXO (first OCXO) according to an exemplary embodiment, the crystal unit 2, the power transistor 3, and the like are mounted on the circuit board 1 such as ceramic, and the circuit board 1 is fixed to the metal base 4 using metal pins 5 as illustrated in FIG. 2. The mounting surface of the crystal unit 2 and the like is arranged to face the metal base 4 side. In addition, the metal cover 6 is installed to cover the metal base 4.

In the OCXO in prior art, the inside of the metal cover is filled with the air or gas. Since heat is transferred through the air or gas, the temperature characteristic is influenced, and performance is degraded accordingly. In the first OCXO, the inside of the metal cover 4 is encapsulated in vacuum. If the vacuum encapsulation is used, thermal conduction becomes zero in principle, or influence of the external air can be neglected. That is, it is possible to manufacture an oscillator that is not influenced by the ambient temperature and provide an oscillator having an excellent temperature characteristic.

In a typical OCXO, an oven is internally provided to maintain a constant temperature of about 90° C. In order to maintain that temperature, the heater resistor or the power transistor generates heat at all times. The heat is transferred to the metal cover through the air so as to radiate heat. This causes useless power consumption. Furthermore, due to miniaturization tendency in recent years, the air layer in the oven is also reduced, and a distance between a heat generating portion and the cover is reduced, so that heat tends to be easily dissipated from the air.

Therefore, if the vacuum encapsulation is used as in the first OCXO, the thermal conduction becomes zero in principle. Therefore, it is possible to prevent heat from being dissipated from the inside through the space. For this reason, it is possible to efficiently maintain a constant temperature with the minimum heat and reduce the power consumption.

Although structural studies are necessary in order to suppress the heat radiation to the minimum in prior art, the configuration of the first OCXO can be simplified using vacuum encapsulation. In addition, it is possible to arrange a lot of components on the circuit board, suppress cost of the board, easily change a thickness of the board, increase the number of the sheet boards, so as to improve productivity.

Figure 3:
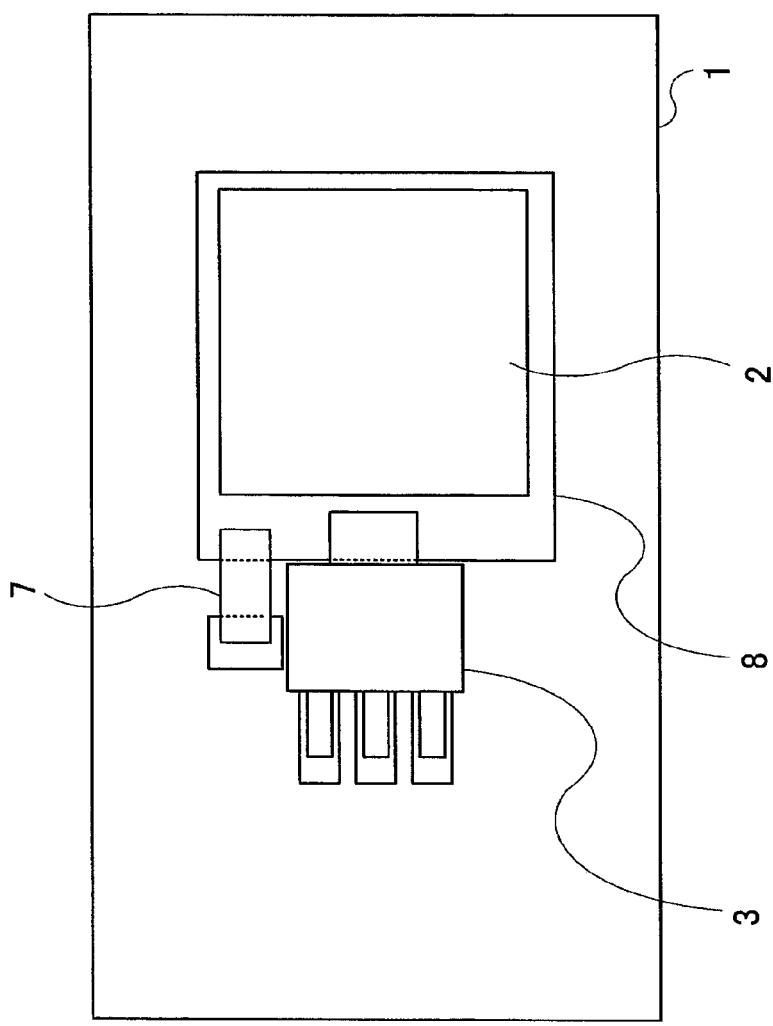
FIG. 3 is an explanatory plan view illustrating a first OCXO according to an exemplary embodiment.

<Plan View of First OCXO: FIG. 3>

Next, a configuration of the first OCXO will be described with reference to FIG. 3. FIG. 3 is an explanatory plan view illustrating the first OCXO according to an exemplary embodiment. As illustrated in FIG. 3, in the first OCXO, a common pattern 8 connected to the ground GND is formed over the circuit board 1, the crystal unit 2 is formed over the common pattern 8, and one terminal of the power transistor 3 (collector terminal) and one end of the sensor (thermistor TH) 7 are connected to the common pattern 8.

The common pattern 8 is formed of a metal pattern such as copper and is connected to a ground level. Since the sensor 7 and the power transistor 3 are physically and electrically connected to each other through this common pattern 8, it is possible to implement an oscillator having high thermal responsiveness and an excellent thermal conduction property in comparison with insulative thermal conduction silicon. In addition, it is preferable that heat be efficiently transferred to the crystal unit 2 by connecting the ground terminal (GND terminal) of the crystal unit 2 to the common pattern 8.

Figure 4:
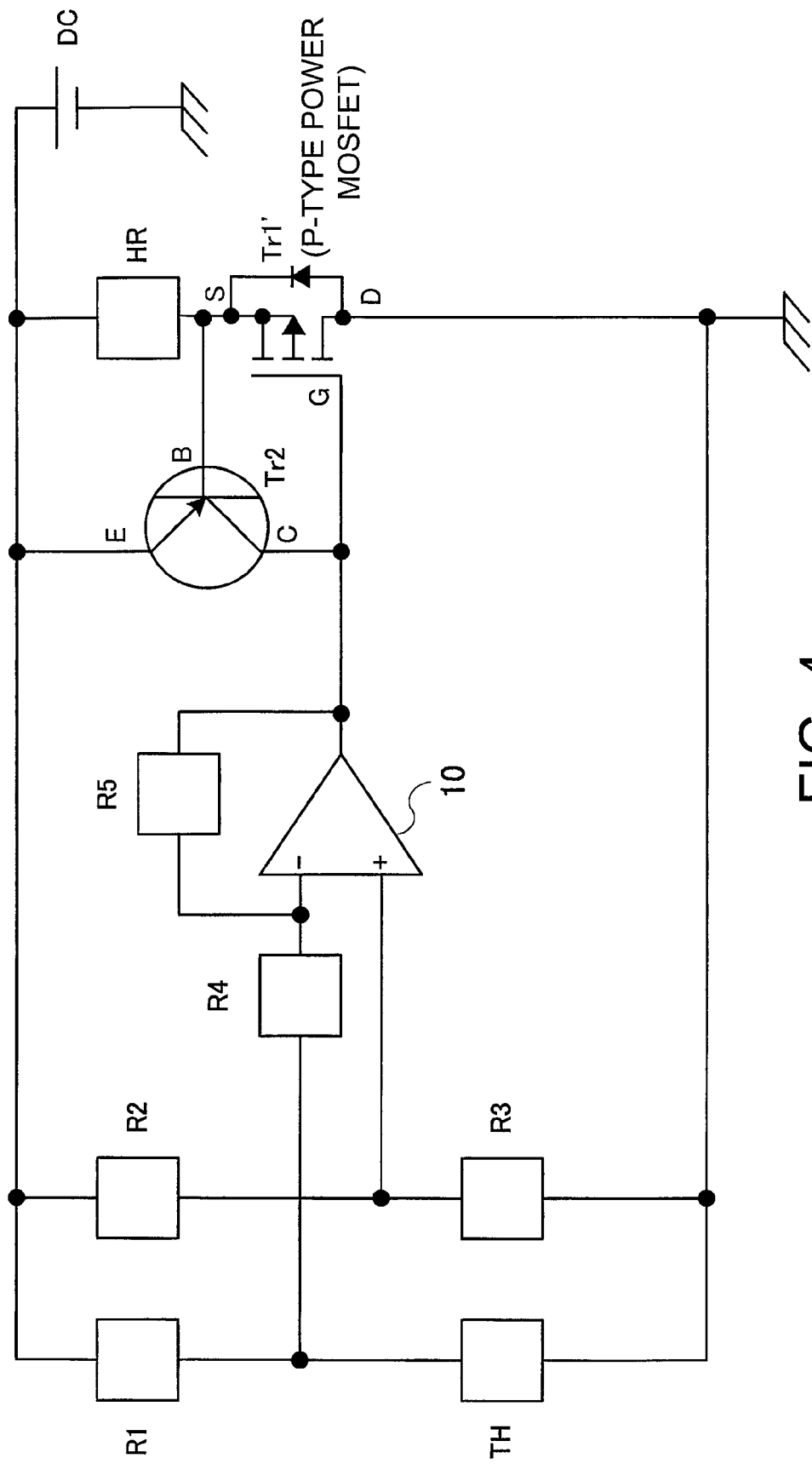
FIG. 4 is a circuit diagram illustrating a second temperature control circuit of the oven-controlled crystal oscillator according to an exemplary embodiment.

<Second Temperature Control Circuit of Oven-Controlled Crystal Oscillator: FIG. 4>

A second temperature control circuit of the oven-controlled crystal oscillator according to an embodiment disclosed herein will be described with reference to FIG. 4. FIG. 4 is a circuit diagram illustrating a second temperature control circuit of the oven-controlled crystal oscillator according to an exemplary embodiment. As illustrated in FIG. 4, the second temperature control circuit (second circuit) of the oven-controlled crystal oscillator has a configuration similar to that of the circuit of FIG. 1 except that, instead of the PNP-type power transistor Tr1, a P-type power metal oxide semiconductor field effect transistor (MOSFET) is used as the power transistor Tr1.

<Power Transistor Tr1'>

The power transistor Tr1' is a P-type power MOSFET, in which the output of the differential amplifier IC10 is input to a gate, and an electric current between a drain and a source is controlled depending on a voltage applied to the gate, so that an electric current also flows to the heater resistor HR. Since the power transistor Tr1' limits the electric current flowing through the heater resistor FIR based on the operation of the current-limiting transistor Tr2, the heater resistor HR does not serve as a heat source, and only the power transistor Tr1' serves as a heat source. In particular, the drain (GND side) of the power transistor Tr1' generates heat.

<Current-Limiting Transistor Tr2>

In the current-limiting transistor Tr2, a voltage in a node on the line connecting the other end of the heater resistor HR and the source of the power transistor Tr1' is applied to a base, and the electric current flowing through an emitter connected to the power voltage DC and the electric current flowing through a collector connected to the gate of the power transistor Tr1' are controlled depending on the applied voltage.

That is, a voltage applied to the base of the current-limiting transistor Tr2 becomes variable depending on the electric current flowing through the source of the power transistor Tr1', and the electric current flowing through the emitter and the collector of the current-limiting transistor Tr2 also becomes variable.

In the first oven-controlled crystal oscillator (first OCXO) according to an embodiment disclosed herein, the aforementioned temperature control circuit (second circuit) is incorporated, and the inside of the metal cover 6 is encapsulated in vacuum. Therefore, it is possible to prevent heat radiation to the outside and maintain the inside at a constant temperature with the minimum heat.

Figure 5:
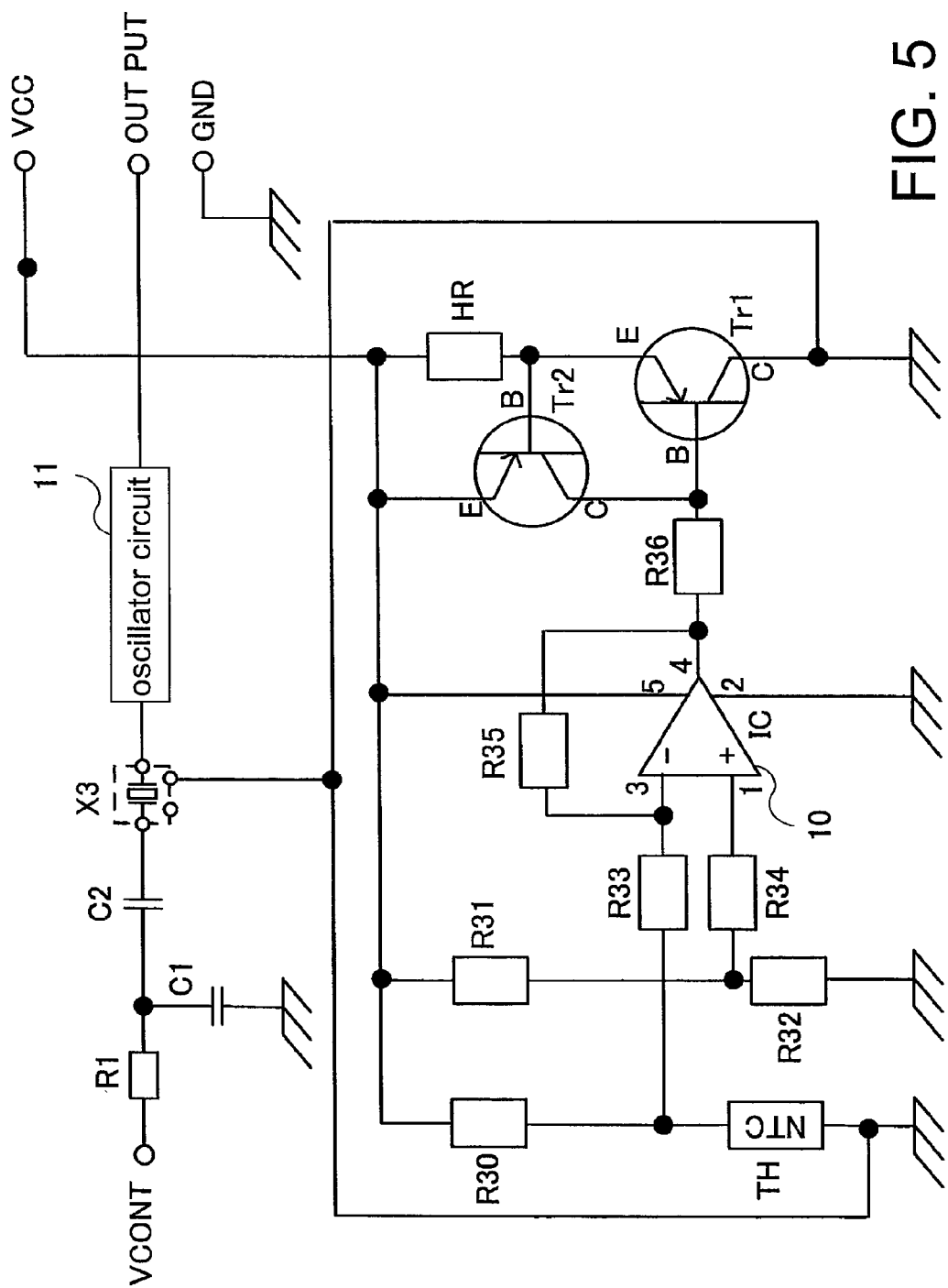
FIG. 5 is a circuit diagram illustrating a third temperature control circuit of the oven-controlled crystal oscillator according to an exemplary embodiment disclosed herein.

<Third Temperature Control Circuit of Oven-Controlled Crystal Oscillator: FIG. 5>

A third temperature control circuit of the oven-controlled crystal oscillator according to an embodiment disclosed herein will be described with reference to FIG. 5. FIG. 5 is a circuit diagram illustrating a third temperature control circuit of the oven-controlled crystal oscillator according to an embodiment disclosed herein. As illustrated in FIG. 5, the third temperature control circuit (third circuit) of the oven-controlled crystal oscillator according to an embodiment disclosed herein basically includes a thermistor TH, a differential amplifier (OPAMP) IC10, a power transistor Tr1, a heater resistor HR, and a current-limiting transistor Tr2. In addition, the power transistor Tr1 and the current-limiting transistor Tr2 are not NPN-type transistors but PNP-type transistors. However, as illustrated in FIG. 4, the power transistor Tr1 may be a P-type power MOSFET.

Referring to FIG. 5, in addition to the third temperature control circuit, a crystal unit X3 and an oscillator circuit 11 are illustrated, and a terminal for receiving a control voltage VCONT is provided in the input side of the crystal unit X3. A resistor R1 and a capacitor C2 are connected in series to the terminal and are connected to the input of the crystal unit X3. In addition, one end of the capacitor C1 is connected between the resistor R1 and the capacitor C2, and the other end of the capacitor C1 is grounded. In addition, the output of the crystal unit X3 is input to the oscillator circuit 11, and the output of the oscillator circuit 11 is connected to the output terminal (OUTPUT).

As a characteristic of the third circuit, the ground terminal (GND terminal) of the crystal unit X3 is connected to the GND side of the thermistor TH and the collector (GND terminal) of the power transistor Tr1. That is, the crystal unit X3, the thermistor TH as a temperature sensor, and the power transistor Tr1 as a heat source are electrically connected to the ground level (GND level). In particular, electrical connection to the GND level is directly made using a copper pattern having high thermal conduction. As a result, a thermal resistance between the crystal unit X3, the temperature sensor, and the heat source can be infinitely zero. In addition, copper has a thermal conductivity of 403 W/m·k. In comparison, aluminum has a thermal conductivity of 236403 W/m·k, and high thermal conduction silicon has a thermal conductivity of 2.4 W/m·k.

Although the thermistor TH is used as a temperature sensor, a resistance sensor such as a platinum resistor, a thermocouple, and a linear resistor may be used instead. In addition, temperature control is performed using proportional (P) control, proportional and integral (PI) control, proportional, integral, and derivative (PID) control, and the like. The temperature control circuit may be integrated into a discrete component and an integrated circuit (IC) such as an application specific integrated circuit (ASIC).

Figure 6:
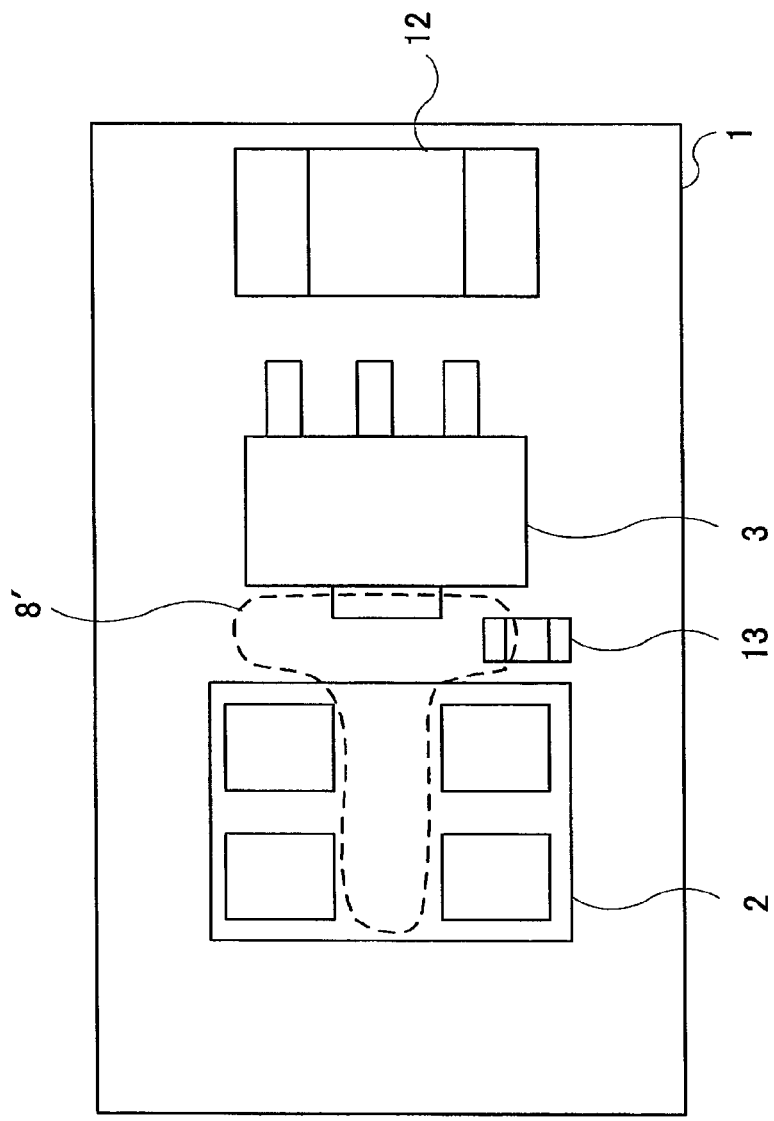
FIG. 6 is an explanatory plan view illustrating a second OCXO according to an exemplary embodiment.

<Plan View of Second OCXO: FIG. 6>

Next, a configuration of the second OCXO will be described with reference to FIG. 6. FIG. 6 is an explanatory plan view illustrating the second OCXO according to an exemplary embodiment. In the second OCXO, the crystal unit 2 is formed over the circuit board 1, the thermistor 13 and the power transistor 3 are arranged in the vicinity thereof, and the heater resistor 12 is arranged far from the crystal unit 2, as illustrated in FIG. 6.

The common pattern 8' is formed in contact with the GND terminal of the power transistor 3 (left terminal of the power transistor 3 in FIG. 6), the GND terminal of the thermistor 13 (upper terminal of the thermistor 13 in FIG. 6), and the metal cover of the crystal unit 2. The common pattern 8' is formed of a metal pattern such as copper and is connected to a ground level. Since the crystal unit 2, the power transistor 3, and the thermistor 13 are physically and electrically connected to each other through this common pattern 8', it is possible to implement an oscillator having an excellent thermal conduction property and high thermal responsiveness in comparison with insulative thermal conduction silicon.

Although the common pattern 8' is formed over the metal cover to cover the metal cover, the common pattern 8' may be formed over the circuit board 1, and then the GND terminal of the power transistor 3, the GND terminal of the thermistor 13, and the GND terminal of the crystal unit 2 may be connected to the common pattern 8' so as to efficiently transfer heat.

Figure 7:
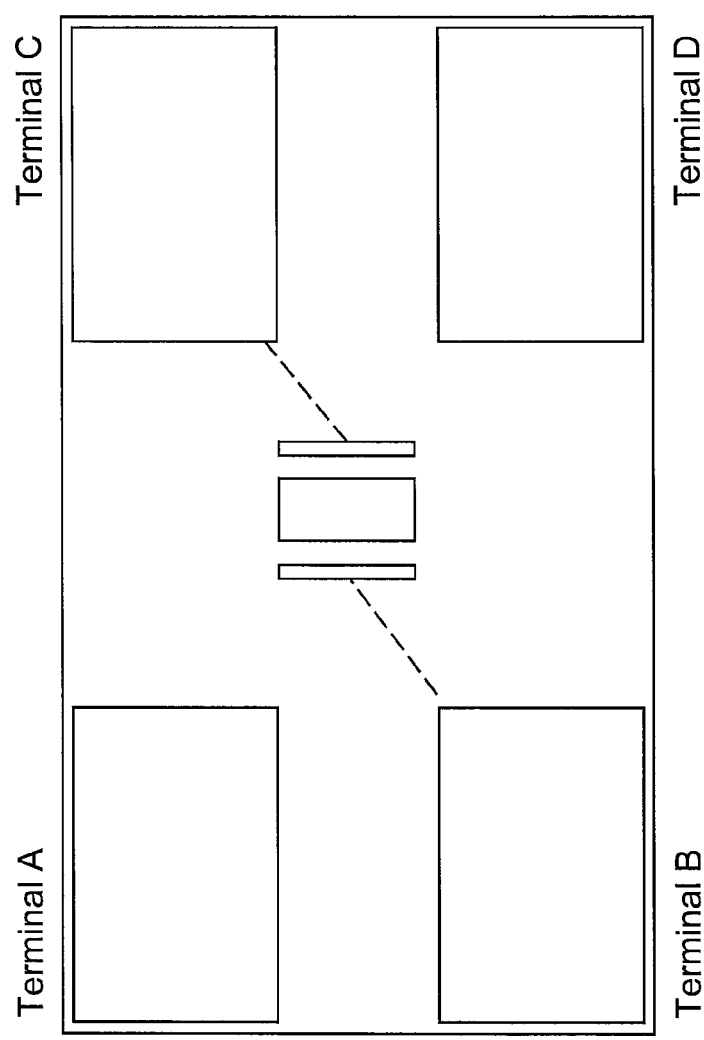
FIG. 7 is a schematic diagram illustrating a surface mount type crystal unit package.
Figure 8:
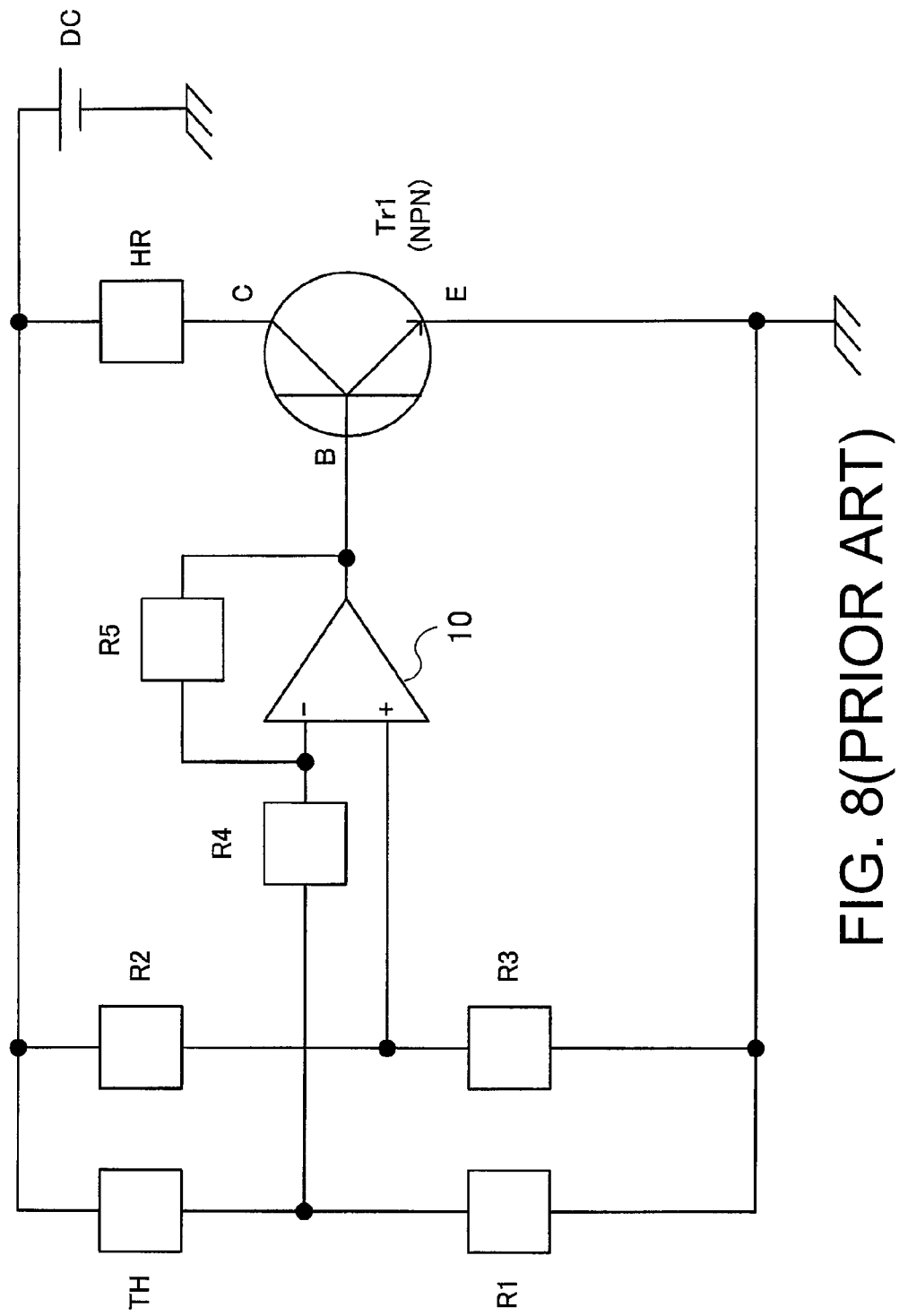
FIG. 8 is a circuit diagram illustrating a temperature control circuit of the oven-controlled crystal oscillator in prior art.
Figure 9:
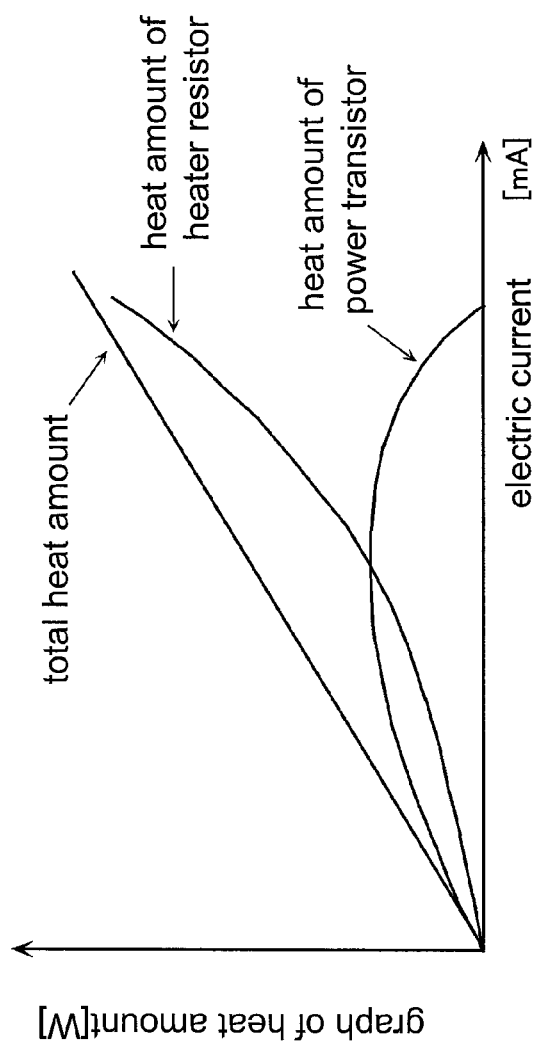
FIG. 9 is a graph illustrating a heat amount.
Figure 10:
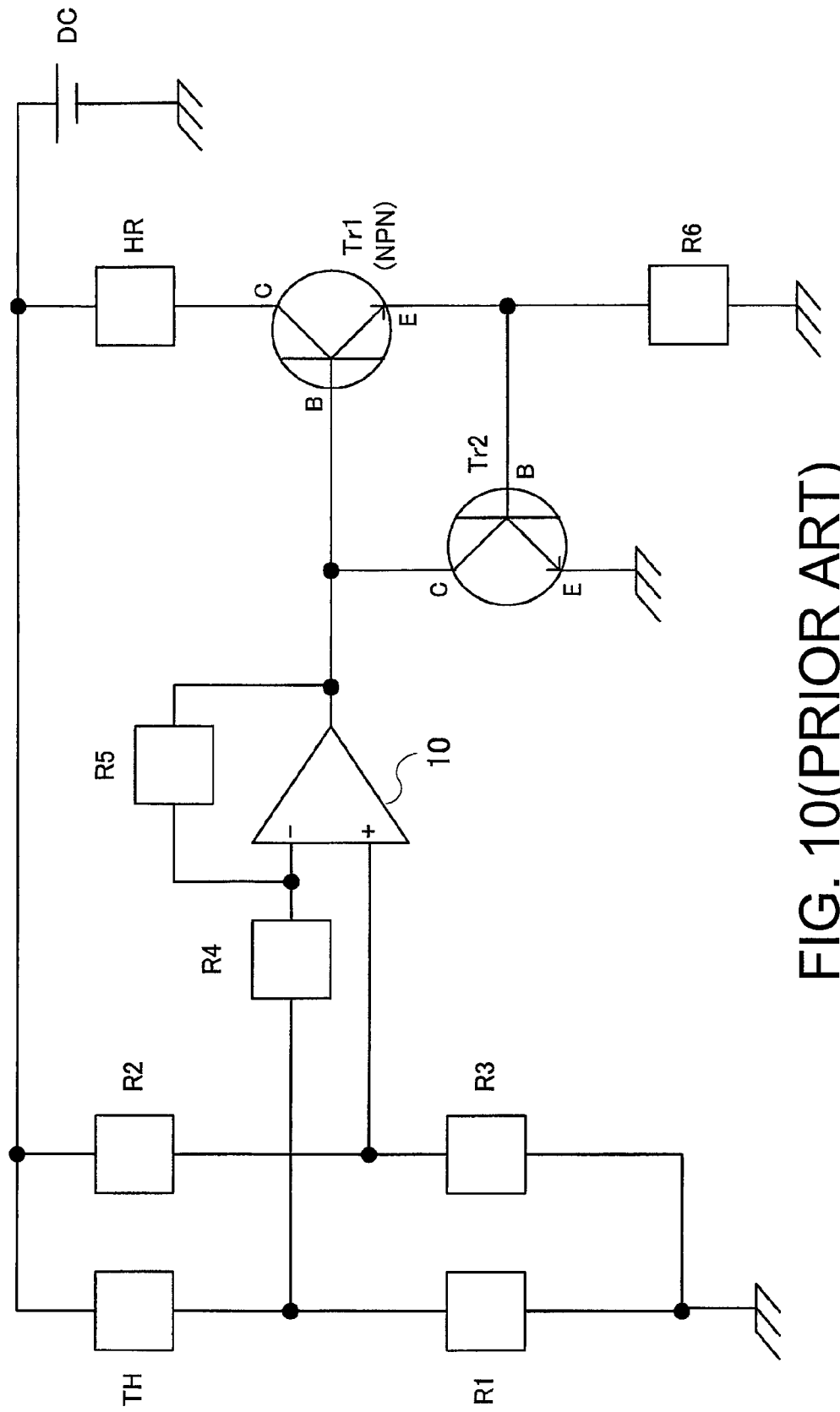
FIG. 10 is a circuit diagram illustrating a temperature control circuit having a current-limiting circuit.
Figure 11:
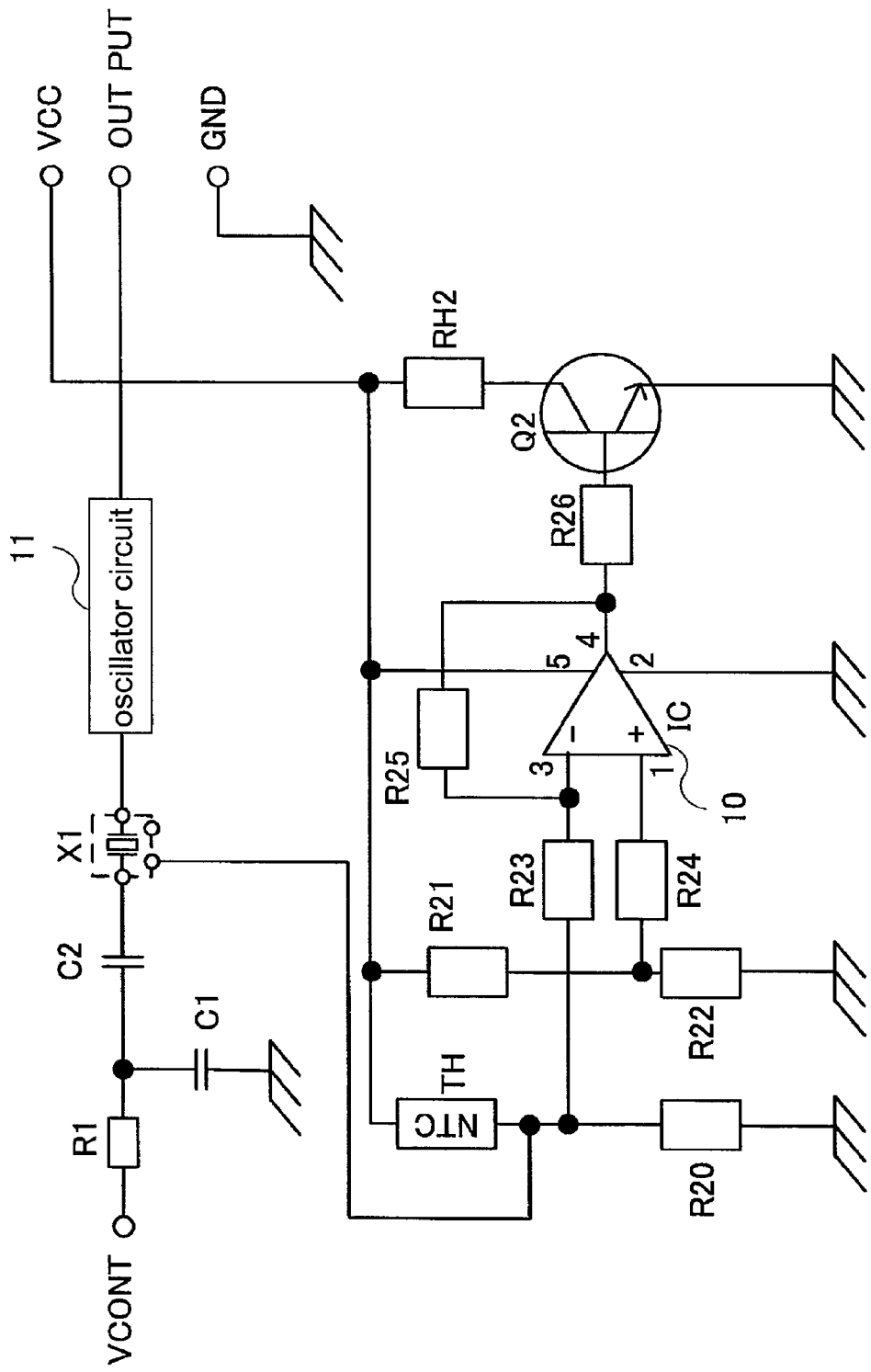
FIG. 11 is a circuit diagram illustrating an improved thermostatic oven control circuit.

<Surface Mount Type Crystal unit Package: FIG. 7>

The crystal unit package used in the third circuit will be described with reference to FIG. 7. FIG. 7 is a schematic diagram illustrating the surface mount type crystal unit package. As illustrated in FIG. 7, the crystal unit is configured using a surface mount device (SMD) package item and has terminals, including terminals B and C connected to a crystal wafer and terminals A and D connected to a metal cover and an internal package.

The terminals A and D are connected through a metal cover casing and are connected to the ground GND. Although four terminals are provided using the SMD package item, other terminals may be provided. In addition, the terminals A and D may not be connected through the metal cover casing. The metal cover is made of, for example, kovar.

According to this disclosure, there is provided a temperature control circuit of a thermostatic oven in an oven-controlled crystal oscillator, including: a heater resistor having one end where a power voltage is supplied to generate heat; a first resistor having one end where a power voltage is supplied; a thermistor of which one end is connected to the other end of the first resistor, and the other end is grounded, so that a voltage depending on a temperature is output to the one end by setting a resistance value to be variable depending on a temperature; a second resistor having one end where a power voltage is supplied; a third resistor of which one end is connected to the other end of the second resistor, and the other end is grounded; a differential amplifier of which one input terminal receives a voltage between the other end of the first resistor and the one end of the thermistor, the other input terminal receives a voltage between the other end of the second resistor and the one end of the third resistor, and an output is fed back to the one input terminal through a fourth resistor, so that a difference between the voltage received by the other input terminal and the voltage received by the one input terminal is amplified and output as a control voltage; a PNP-type power transistor having an emitter where the other end of the heater resistor is connected, a base that receives an output of the differential amplifier, and a collector which is grounded; and a PNP-type current-limiting transistor having an emitter where a power voltage is supplied, a base that receives a voltage between the other end of the heater resistor and the emitter of the power transistor, and a collector connected to a base of the power transistor. As a result, the power transistor is used as a heat source by limiting the electric current flowing to the heater resistor using the current-limiting transistor. Therefore, thermal dispersion is prevented, and the collector of the power transistor and the other end of the thermistor are commonly connected to a ground level, so that the heat of the heat source can be efficiently transferred to the thermistor. It is possible to improve control sensitivity and implement an excellent temperature characteristic.

According to this disclosure, there is provided a temperature control circuit of a thermostatic oven in an oven-controlled crystal oscillator, including: a heater resistor having one end where a power voltage is supplied to generate heat; a first resistor having one end where a power voltage is supplied; a thermistor of which one end is connected to the other end of the first resistor, and the other end is grounded, so that a voltage depending on a temperature is output to the one end by setting a resistance value to be variable depending on a temperature; a second resistor having one end where a power voltage is supplied; a third resistor of which one end is connected to the other end of the second resistor, and the other end is grounded; a differential amplifier of which one input terminal receives a voltage between the other end of the first resistor and the one end of the thermistor, the other input terminal receives a voltage between the other end of the second resistor and the one end of the third resistor, and an output is fed back to the one input terminal through a fourth resistor, so that a difference between the voltage received by the other input terminal and the voltage received by the one input terminal is amplified and output as a control voltage; a P-type field-effect power transistor (power MOSFET) having a source where the other end of the heater resistor is connected, a gate that receives an output of the differential amplifier, and a drain which is grounded; and a PNP-type current-limiting transistor having an emitter where a power voltage is supplied, a base that receives a voltage between the other end of the heater resistor and the source of the power MOSFET, and a collector connected to the gate of the power MOSFET. As a result, the power transistor is used as a heat source by limiting the electric current flowing to the heater resistor using the current-limiting transistor. Therefore, thermal dispersion is prevented, and the collector of the power MOSFET and the other end of the thermistor are commonly connected to a ground level, so that the heat of the heat source can be efficiently transferred to the thermistor. It is possible to improve control sensitivity and implement an excellent temperature characteristic.

In the first circuit, the collector side of the PNP type power transistor Tr1 and the thermistor TH side are connected to a ground level using the metal common pattern 8, a PNP-type current-limiting transistor Tr2 is provided for limiting the electric current flowing through the heater resistor HR connected to the emitter of the power transistor Tr1, and heat sources are unified into the power transistor Tr1 to prevent thermal dispersion, so that the heat generated from the collector of the power transistor Tr1 can be efficiently transferred to the commonly-connected thermistor TH (sensor 7). Therefore, it is possible to improve thermal responsiveness and implement an oscillator having an excellent temperature characteristic.

In the second circuit, the thermistor TH side and the drain side of the power transistor Tr1' of the P-type power MOSFET are connected to a ground level using the metal common pattern 8, a PNP-type current-limiting transistor Tr2 is provided for limiting the electric current flowing through the heater resistor HR connected to the source of the power transistor Tr1', and the heat sources are unified into the power transistor Tr1' to prevent thermal dispersion, so that the heat of the drain of the power transistor Tr1' can be efficiently transferred to the commonly-connected thermistor TH (sensor 7). Therefore, it is possible to improve thermal responsiveness and implement an oscillator having an excellent temperature characteristic.

By incorporating the first or second circuit into the first oven-controlled crystal oscillator, it is possible to implement a high stability oscillator.

In addition, in the first OCXO, by encapsulating the inside of the metal cover 6 in vacuum, it is possible to prevent heat radiation to the outside and maintain the inside at a constant temperature with the minimum heat.

In the third circuit, the thermistor TH side and the collector side of the PNP-type power transistor Tr1, and the GND terminal of the crystal unit are connected to a ground level using the metal common pattern 8' such as copper, the PNP-type current-limiting transistor Tr2 is provided for limiting the electric current flowing through the heater resistor HR connected to the emitter of the power transistor Tr1, and the heat sources are unified into the power transistor Tr1 to prevent thermal dispersion, so that the heat of the collector of the power transistor Tr1 can be efficiently transferred to the crystal unit 2 and the commonly-connected thermistor TH. Therefore, it is possible to improve thermal responsiveness and implement an oscillator having an excellent temperature characteristic.

Consequently, in the third circuit, thermal resistances in the thermistor of the temperature sensor, the heat source of the power transistor, and the crystal unit of the temperature control target can be infinitely zero. As a result, it is possible to obtain an excellent frequency-temperature characteristic through uniform temperature control and improve control responsiveness, so that a frequency characteristic has a fast rising edge. In addition, since useless heat radiation is removed, it is possible to save power consumption. Furthermore, since direct connection can be made without using resin and the like, it is possible to simplify assembling. Moreover, since the thermal resistance is reduced to the minimum, it is possible to simplify temperature control design.

In the third circuit, the heat of the heat source of the power transistor Tr1 is transferred to the metal cover of the crystal unit 2 through the common pattern 8' and may be further transferred to the GND terminal of the crystal unit 2. Therefore, it is possible to obtain an easy configuration.

The invention disclosed herein may be preferably applied to a temperature control circuit of an oven-controlled crystal oscillator having an excellent temperature characteristic by preventing thermal dispersion and improving thermal conduction efficiency in the circuit.

What is claimed is:

1. A temperature control circuit of a thermostatic oven in an oven-controlled crystal oscillator, comprising:
    a heater resistor having one end where a power voltage is supplied to generate heat;
    a first resistor having one end where a power voltage is supplied;
    a thermistor of which one end is connected to the other end of the first resistor, and the other end is grounded, so that a voltage depending on a temperature is output to the one end by setting a resistance value to be variable depending on a temperature;
    a second resistor having one end where a power voltage is supplied;
    a third resistor of which one end is connected to the other end of the second resistor, and the other end is grounded;
    a differential amplifier of which one input terminal receives a voltage between the other end of the first resistor and the one end of the thermistor, the other input terminal receives a voltage between the other end of the second resistor and the one end of the third resistor, and an output is fed back to the one input terminal through a fourth resistor, so that a difference between the voltage received by the other input terminal and the voltage received by the one input terminal is amplified and output as a control voltage;
    a PNP-type power transistor having an emitter where the other end of the heater resistor is connected, a base that receives an output of the differential amplifier, and a collector which is grounded; and
    a PNP-type current-limiting transistor having an emitter where a power voltage is supplied, a base that receives a voltage between the other end of the heater resistor and the emitter of the power transistor, and a collector connected to the base of the power transistor.

2. The temperature control circuit according to claim 1, wherein the other end of the thermistor and the collector of the power transistor are connected with a common metal pattern.

3. A temperature control circuit of a thermostatic oven in an oven-controlled crystal oscillator, comprising:
    a heater resistor having one end where a power voltage is supplied to generate heat;
    a first resistor having one end where a power voltage is supplied;
    a thermistor of which one end is connected to the other end of the first resistor, and the other end is grounded, so that a voltage depending on a temperature is output to the one end by setting a resistance value to be variable depending on a temperature;
    a second resistor having one end where a power voltage is supplied;
    a third resistor of which one end is connected to the other end of the second resistor, and the other end is grounded;
    a differential amplifier of which one input terminal receives a voltage between the other end of the first resistor and the one end of the thermistor, the other input terminal receives a voltage between the other end of the second resistor and the one end of the third resistor, and an output is fed back to the one input terminal through a fourth resistor, so that a difference between the voltage received by the other input terminal and the voltage received by the one input terminal is amplified and output as a control voltage;
a P-type field-effect power transistor having a source where the other end of the heater resistor is connected, a gate that receives an output of the differential amplifier, and a drain which is grounded; and
a PNP-type current-limiting transistor having an emitter where a power voltage is supplied, a base that receives a voltage between the other end of the heater resistor and the source of the power transistor, and a collector connected to the gate of the power transistor.

4. The temperature control circuit according to claim 3, wherein the other end of the thermistor and the drain of the power transistor are connected with a common metal pattern.

5. An oven-controlled crystal oscillator, comprising:
the temperature control circuit according to claim 1; and
a crystal unit,
wherein the crystal unit is electrically connected with the temperature control circuit.

6. An oven-controlled crystal oscillator, comprising:
the temperature control circuit according to claim 2; and
a crystal unit,
wherein the crystal unit is electrically connected with the temperature control circuit.

7. An oven-controlled crystal oscillator, comprising:
the temperature control circuit according to claim 3; and
a crystal unit,
wherein the crystal unit is electrically connected with the temperature control circuit.

8. An oven-controlled crystal oscillator comprising:
the temperature control circuit according to claim 4; and
a crystal unit,
wherein the crystal unit is electrically connected with the temperature control circuit.

9. An oven-controlled crystal oscillator, comprising:
the temperature control circuit according to claim 2; and
a crystal unit,
wherein the crystal unit is electrically connected with the temperature control circuit,
wherein a ground terminal of the crystal unit is connected to the common metal pattern.

10. An oven-controlled crystal oscillator, comprising:
the temperature control circuit according to claim 4; and
a crystal unit,
wherein the crystal unit is electrically connected with the temperature control circuit,
wherein a ground terminal of the crystal unit is connected to the common metal pattern.

11. An oven-controlled crystal oscillator, comprising:
the temperature control circuit according to claim 2;
a crystal unit; and
a metal cover for covering the crystal unit,
wherein the crystal unit is electrically connected with the temperature control circuit,
wherein a ground terminal of the crystal unit is connected to the metal cover, and the metal cover is connected to the common metal pattern.

12. An oven-controlled crystal oscillator comprising:
the temperature control circuit according to claim 4;
a crystal unit; and
a metal cover for covering the crystal unit,
wherein the crystal unit is electrically connected with the temperature control circuit,
wherein a ground terminal of the crystal unit is connected to the metal cover, and the metal cover is connected to the common metal pattern.

13. The oven-controlled crystal oscillator according to claim 11, wherein the common metal pattern is formed to cover the metal cover of the crystal unit.

14. The oven-controlled crystal oscillator according to claim 12, wherein the common metal pattern is formed to cover the metal cover of the crystal unit.

15. The oven-controlled crystal oscillator according to claim 5, wherein, when a circuit board where the temperature control circuit and the crystal unit are formed is encapsulated using a metal cover, an inner side of the metal cover is encapsulated in vacuum.

16. The oven-controlled crystal oscillator according to claim 9, wherein, when a circuit board where the temperature control circuit and the crystal unit are formed is encapsulated using a metal cover, an inner side of the metal cover is encapsulated in vacuum.

17. The oven-controlled crystal oscillator according to claim 11, wherein, when a circuit board where the temperature control circuit and the crystal unit are formed is encapsulated using a metal cover, an inner side of the metal cover is encapsulated in vacuum.

18. The oven-controlled crystal oscillator according to claim 13, wherein, when a circuit board where the temperature control circuit and the crystal unit are formed is encapsulated using a metal cover, an inner side of the metal cover is encapsulated in vacuum.

* * * * *